United States Patent
Schultheiss

(10) Patent No.: US 11,364,677 B2
(45) Date of Patent: Jun. 21, 2022

(54) METHOD AND DEVICE FOR CORRECTING AN INHOMOGENEOUS INTENSITY DISTRIBUTION OF A RADIATION FIELD GENERATED BY A RADIATION SOURCE

(71) Applicant: Schultheiss GmbH, Heimsheim (DE)

(72) Inventor: Andreas Schultheiss, Muehlacker (DE)

(73) Assignee: Schultheiss GmbH, Heimsheim (DE)

( * ) Notice: Subject to any disclaimer, the term of this patent is extended or adjusted under 35 U.S.C. 154(b) by 923 days.

(21) Appl. No.: 15/677,196

(22) Filed: Aug. 15, 2017

(65) Prior Publication Data

US 2018/0126647 A1 May 10, 2018

Related U.S. Application Data

(63) Continuation of application No. PCT/EP2016/054961, filed on Mar. 9, 2016.

(30) Foreign Application Priority Data

Mar. 9, 2015 (DE) .......................... 10 2015 103 389

(51) Int. Cl.
*B29C 64/286* (2017.01)
*B29C 64/129* (2017.01)
(Continued)

(52) U.S. Cl.
CPC .......... *B29C 64/129* (2017.08); *B29C 64/268* (2017.08); *B29C 64/286* (2017.08);
(Continued)

(58) Field of Classification Search
None
See application file for complete search history.

(56) References Cited

U.S. PATENT DOCUMENTS 5,980,813 A * 11/1999 Narang .................. B29C 64/40
264/401
7,783,371 B2 8/2010 John et al.
(Continued)

FOREIGN PATENT DOCUMENTS

| CH | 405752 | 1/1966 |
|----|--------|--------|
| DE | 2646022 | 4/1977 |

(Continued)

*Primary Examiner* — Mohammad M Ameen
(74) *Attorney, Agent, or Firm* — Lipsitz & McAllister, LLC

(57) ABSTRACT

The invention relates to a device for correcting an inhomogeneous intensity distribution of a radiation field generated by a radiation source, in particular a radiation source for a device for producing three-dimensional articles by the layer-by-layer solidifying, in a build plane, of a material that is solidifiable under the action of radiation. The device comprises a correcting or filtering device that is to be introduced, between the radiation source and the build plane, into a radiation path of a device for producing three-dimensional articles by the layer-by-layer solidifying of a material that is solidifiable under the action of radiation. Further, improved methods for producing a device for correcting an inhomogeneous intensity distribution of a radiation field generated by a radiation source, and methods and devices for producing a three-dimensional article are proposed.

6 Claims, 5 Drawing Sheets

(51) Int. Cl.
*B33Y 10/00* (2015.01)
*B33Y 30/00* (2015.01)
*B33Y 40/00* (2020.01)
*G03F 7/00* (2006.01)
*G03F 7/20* (2006.01)
*B29C 64/268* (2017.01)
*B33Y 50/02* (2015.01)
*B29C 64/393* (2017.01)

(52) U.S. Cl.
CPC ............ *B29C 64/393* (2017.08); *B33Y 10/00* (2014.12); *B33Y 30/00* (2014.12); *B33Y 40/00* (2014.12); *B33Y 50/02* (2014.12); *G03F 7/0037* (2013.01); *G03F 7/2008* (2013.01); *G03F 7/2012* (2013.01)

(56) References Cited

U.S. PATENT DOCUMENTS

| | | | |
|---|---|---|---|
| 7,894,921 B2 | 2/2011 | John et al. | |
| 8,048,359 B2 | 11/2011 | Wang et al. | |
| 8,126,580 B2 | 2/2012 | El-Siblani et al. | |
| 8,815,143 B2 | 8/2014 | John et al. | |
| 2001/0050762 A1* | 12/2001 | Mulkens | G03F 7/70216 355/67 |
| 2003/0032729 A1* | 2/2003 | Takai | C08G 65/18 525/107 |
| 2005/0259785 A1 | 11/2005 | Zhang | |
| 2006/0097199 A1* | 5/2006 | Veen | G03F 7/70191 250/492.23 |
| 2007/0260349 A1 | 11/2007 | John et al. | |
| 2008/0038396 A1* | 2/2008 | John | G03F 7/2022 425/174.4 |
| 2010/0249979 A1 | 9/2010 | John et al. | |
| 2011/0101570 A1 | 5/2011 | John et al. | |
| 2017/0016627 A1* | 1/2017 | Charpentier | C03C 3/087 |

FOREIGN PATENT DOCUMENTS

| | | |
|---|---|---|
| DE | 2646022 A1 * | 4/1977 |
| DE | 138829 | 11/1979 |
| DE | 3319405 | 5/1994 |
| DE | 19929199 | 1/2001 |
| DE | 10130175 | 1/2003 |
| DE | 102013005607 | 9/2014 |
| DE | 102013107571 | 1/2015 |
| EP | 1192041 | 3/2003 |
| EP | 1849586 | 10/2007 |
| EP | 1849587 | 10/2007 |
| EP | 2052693 | 4/2009 |

* cited by examiner

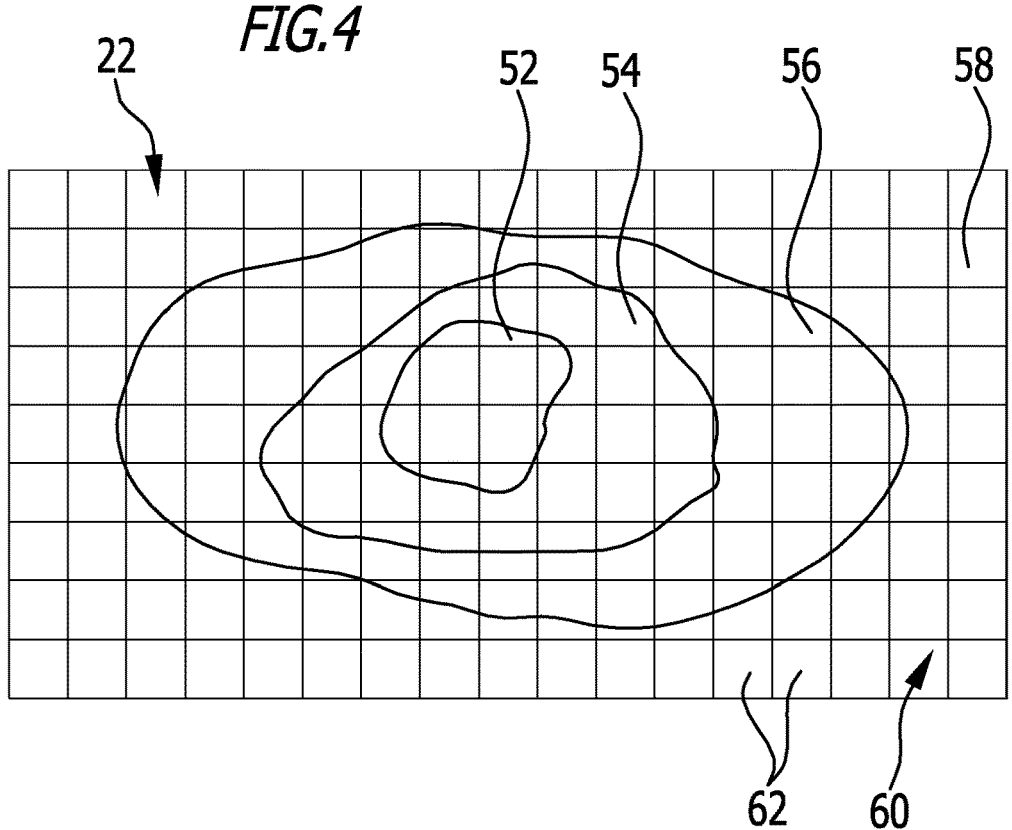
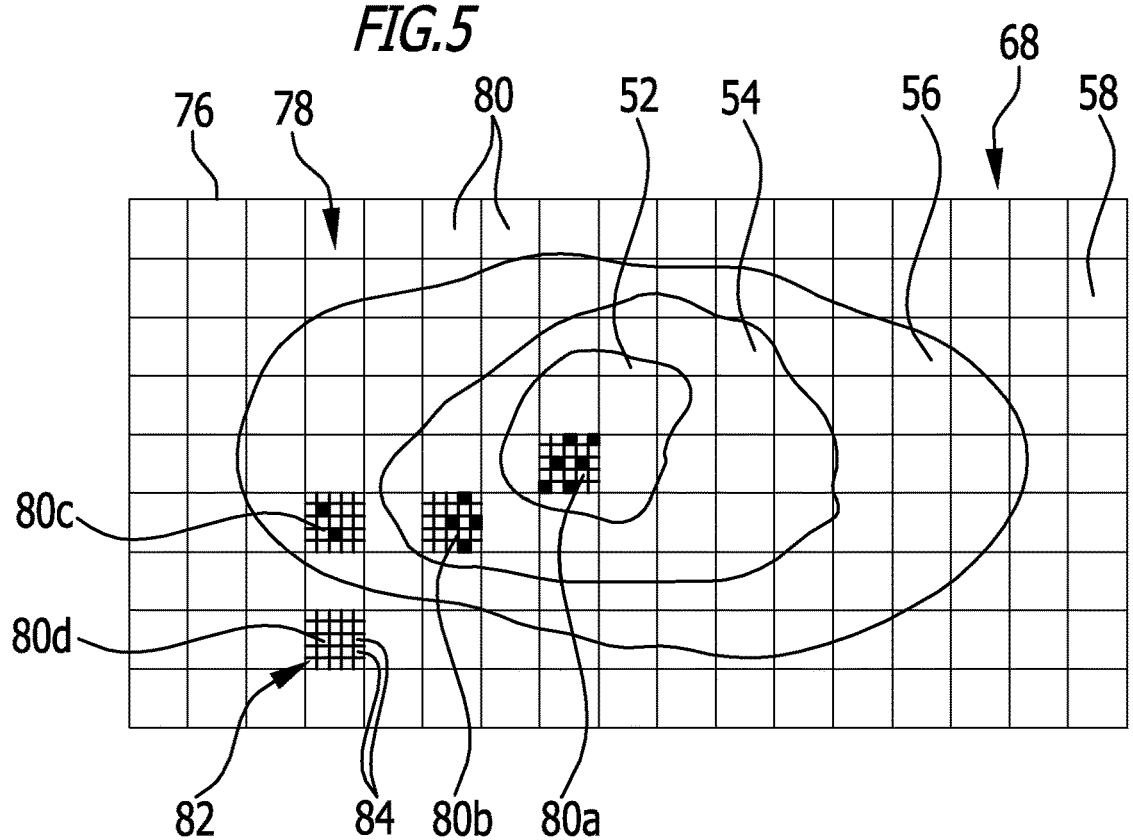

METHOD AND DEVICE FOR CORRECTING AN INHOMOGENEOUS INTENSITY DISTRIBUTION OF A RADIATION FIELD GENERATED BY A RADIATION SOURCE

This application is a continuation of international application number PCT/EP2016/054961 filed on Mar. 9, 2016 and claims the benefit of German application number 10 2015 103 389.5 filed on Mar. 9, 2015, which are incorporated herein by reference in their entirety and for all purposes.

FIELD OF THE INVENTION

The present invention relates to devices for correcting an inhomogeneous intensity distribution of a radiation field generated by a radiation source generally, and more specifically to a device for correcting an inhomogeneous intensity distribution of a radiation field generated by a radiation source, in particular a radiation source for a device for producing three-dimensional articles by the layer-by-layer solidifying, in a build plane, of a material that is solidifiable under the action of radiation.

Further, the present invention relates to methods for producing a device for correcting an inhomogeneous intensity distribution of a radiation field generated by a radiation source generally, and more specifically to a method for producing a device for correcting an inhomogeneous intensity distribution of a radiation field generated by a radiation source, in particular a radiation source of a device for producing three-dimensional articles by the layer-by-layer solidifying, in a build plane, of a material that is solidifiable under the action of radiation.

Moreover, the invention relates to methods for producing a three-dimensional article generally, and more specifically to a method for producing a three-dimensional article by the layer-by-layer solidifying of a material that is solidifiable under the action of radiation, wherein the radiation is imaged in a build plane using an optical imaging device, for the purpose of successively building up solid article layers in the build plane, in which method setpoint layer image data are provided for each article layer to be solidified in the build plane.

Furthermore, the present invention relates to devices for producing a three-dimensional article generally, and more specifically to a device for producing a three-dimensional article by the layer-by-layer solidifying of a material that is solidifiable under the action of radiation, having a radiation source for generating the radiation and an optical imaging device for imaging, in a build plane, a radiation field that is generated by the radiation source.

Methods and devices of the type mentioned in the introduction are known in a variety of forms, for example from DE 199 29 199 A1. There, three-dimensional articles are produced by means of layer-by-layer curing or fusing of preferably plastics materials by means of digital mask exposure, in which the energy input by surface area is controlled in dependence on the light output over the exposure time.

BACKGROUND OF THE INVENTION

When three-dimensional articles are produced by these methods and devices, various problems arise that have to be solved. For example, it is in particular important to homogenise a distribution of light intensity. As a result of an optical system that is used and that includes in particular a radiation source and an optical projection system, an inhomogeneous intensity distribution typically results during the imaging. However, as far as possible an inhomogeneity of this kind must be avoided so that the intensity distribution of the radiation field generated by the radiation source and an optical imaging device—called the optical system below—is as homogeneous as possible in a build projection plane—also simply called the build plane below—in which the three-dimensional article is created.

SUMMARY OF THE INVENTION

In a first aspect of the invention, a device for correcting an inhomogeneous intensity distribution of a radiation field generated by a radiation source, in particular a radiation source for a device for producing three-dimensional articles by the layer-by-layer solidifying, in a build plane, of a material that is solidifiable under the action of radiation, is provided. The device comprises a correcting or filtering device that is to be introduced, between the radiation source and the build plane, into a radiation path of a device for producing three-dimensional articles by the layer-by-layer solidifying of a material that is solidifiable under the action of radiation.

In a second aspect of the invention, a method for producing a device for correcting an inhomogeneous intensity distribution of a radiation field generated by a radiation source, in particular a radiation source of a device for producing three-dimensional articles by the layer-by-layer solidifying, in a build plane, of a material that is solidifiable under the action of radiation is provided. An intensity distribution of the radiation field is measured or calculated in a calibration surface between the radiation source and the build plane or in the build plane and a correcting or filtering device to be introduced into the radiation path is formed in dependence on the intensity distribution of the radiation field in the calibration surface such that the intensity distribution of the radiation field in the build plane is homogeneous after passing through the correcting or filtering device.

In a third aspect of the invention, a method for producing a three-dimensional article by the layer-by-layer solidifying of a material that is solidifiable under the action of radiation is provided. The radiation is imaged in a build plane using an optical imaging device, for the purpose of successively building up solid article layers in the build plane. In which method setpoint layer image data are provided for each article layer to be solidified in the build plane. Further, a device for correcting an inhomogeneous intensity distribution of a radiation field defined by the radiation source is provided and is introduced into a radiation path between the radiation source generating the radiation and the build plane. Further, a radiation field corresponding to the setpoint layer image data is generated for the purpose of irradiating the build plane.

In a fourth aspect of the invention, a device for producing a three-dimensional article by the layer-by-layer solidifying of a material that is solidifiable under the action of radiation is provided. The device has a radiation source for generating the radiation and an optical imaging device for imaging, in a build plane, a radiation field that is generated by the radiation source. The device comprises a device for correcting an inhomogeneous intensity distribution of a radiation field generated by the radiation source. The device for correcting the inhomogeneous intensity distribution of the radiation field generated by the radiation source comprises a correcting or filtering device that is to be introduced, between the radiation source and the build plane, into a radiation path of the device for producing three-dimensional articles by the layer-by-layer solidifying of a material that is solidifiable under the action of radiation.

BRIEF DESCRIPTION OF THE DRAWING FIGURES

The foregoing summary and the following description may be better understood in conjunction with the drawing figures, of which:

FIG. 4 shows a schematic illustration of a radiation field of a radiation source;

FIG. 5 shows a schematic illustration of a correcting or filtering device for compensating for the radiation field that is illustrated schematically in FIG. 4;

DETAILED DESCRIPTION OF THE INVENTION

Figure 1:
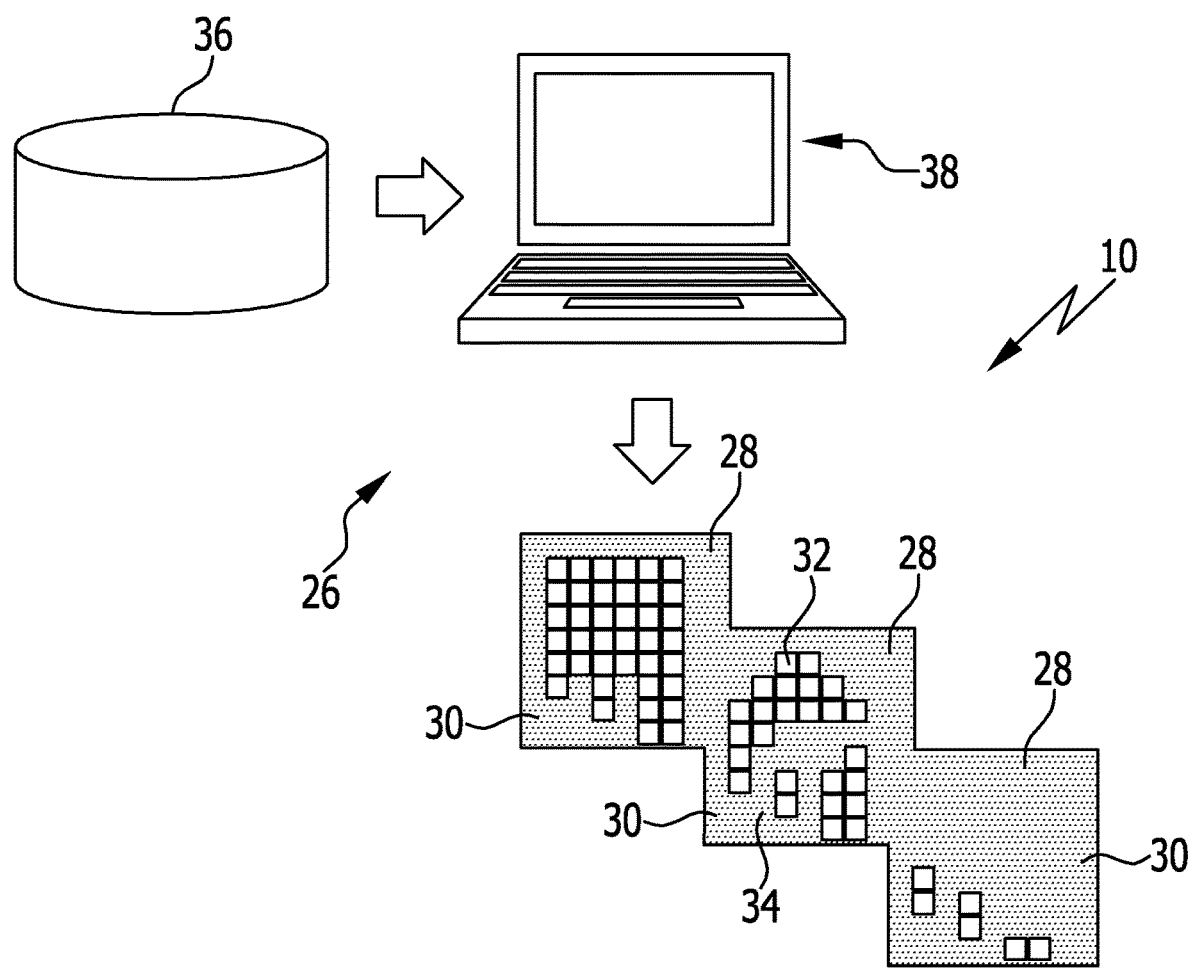
FIG. 1 shows a schematic illustration of a part of a device for producing a three-dimensional article.

Although the invention is illustrated and described herein with reference to specific embodiments, the invention is not intended to be limited to the details shown. Rather, various modifications may be made in the details within the scope and range of equivalents of the claims and without departing from the invention.

The present invention relates to a device for correcting an inhomogeneous intensity distribution of a radiation field generated by a radiation source, in particular a radiation source for a device for producing three-dimensional articles by the layer-by-layer solidifying, in a build plane, of a material that is solidifiable under the action of radiation, characterised by a correcting or filtering device that is to be introduced, between the radiation source and the build plane, into a radiation path of a device for producing three-dimensional articles by the layer-by-layer solidifying of a material that is solidifiable under the action of radiation.

It is thus possible, using the correcting or filtering device, in particular to compensate for an inhomogeneity of the radiation field, largely and ideally entirely. In all cases, using the correcting or filtering device, the radiation field can be made markedly homogenous by comparison with a radiation field without a correcting or filtering device. For this purpose, the correcting or filtering device in particular takes a form such that it is adapted to the general or individual inhomogeneity of the radiation field; that is to say that it is itself not homogeneous in form either but has inhomogeneous filter properties corresponding to the inhomogeneity of the radiation field. In this way, the specific locations where the radiation field has a higher intensity may undergo a more pronounced attenuation than the locations where the radiation field has a lower intensity. Preferably, the correcting or filtering device takes a form such that the radiation field undergoes no attenuation in the regions in which the intensity of the radiation field is minimal. In this way, in particular excessive heating of the correcting or filtering device may be avoided and moreover elimination of the radiation may be minimised. In particular, the correcting or filtering device may take a form such that it may be used in absorption or reflection. The term "general inhomogeneity" should in particular be understood to mean an inhomogeneity of the optical system that is due to attenuation in the intensity in marginal regions because of the type of imaging devices used. The term "individual inhomogeneity" should in particular be understood to mean an inhomogeneity that is caused by the individual optical system—that is to say in particular the radiation source in conjunction with the imaging device.

It is favourable if the correcting or filtering device includes a substrate and at least one correcting or filtering coating that is formed on or applied to the substrate. A substrate can be handled in a simple manner. It may in particular take a rigid or substantially rigid or indeed flexible form. The correcting or filtering coating may also include a plurality of coats or layers which may be optimised in particular for the absorption of electromagnetic radiation in different wavelength ranges. The correcting or filtering coating may optionally take the form of a digital structure, that is to say in particular extremely small surface regions that absorb or reflect completely, for example by being made black, with the result that for example optical pixels are formed by a plurality of blackened and non-blackened surface regions of the substrate. In particular, the correcting or filtering coating may be in a grid pattern, for example with a resolution that is higher, in particular markedly higher, than a resolution of a pixel grid that is used for exposing the solidifiable material. It is thus possible, in the manner described, to generate a correcting or filtering device individually for each radiation source and hence generally or individually for each device for producing three-dimensional articles. The correcting or filtering device may for example be measured or determined once the radiation source has been installed, by a one-off measurement of the radiation field. On the basis of the inhomogeneity of the measured radiation field, it is then possible to generate the correcting or filtering device individually, for example by applying an appropriate correcting or filtering coating to the substrate. A general adaptation may for example be made by more pronounced filtering—that is to say, attenuation—of typical regions of higher intensity, without correcting the individual characteristic of the individual optical system. The correcting or filtering coating may be applied in any desired way, for example as a reflective correcting or filtering coating for at least partly deflecting the radiation, by chemical or physical deposition methods such as CVD or PVD.

Preferably, the correcting or filtering coating takes a form for at least partly absorbing radiation or at least partly deflecting radiation from the radiation field, this radiation being generated by the radiation source. In particular, the correcting or filtering coating must absorb more radiation in locations where the intensity of the radiation field is greater than a minimum value of the radiation field. As described, this may be done by different stages, for example by a different thickness of the correcting or filtering coating, or indeed by an additional grid arrangement of each optical pixel that is used for forming the three-dimensional article, by a grid pattern with markedly higher resolution, that is to say in practice a sub-pixel grid pattern for each optical pixel. This may be achieved in a simple manner for example in that the correcting or filtering device in the radiation path is introduced where the radiation field is widened to its maximum surface area. In this way, the correcting or filtering coating may be applied at a constant coating thickness, in which case the correcting or filtering coating does not completely cover the surface of the substrate but specifically only individual regions, for example substrate pixels of the substrate. For the at least partial deflection of radiation out of the radiation field, the correcting or filtering coating may take a partially reflective form such that radiation is eliminated or removed from the radiation field by deflection precisely at the locations where high intensities occur. This may also be achieved using a sub-pixel grid pattern such that substrate pixels take a reflective form, and deflect radiation from the radiation field in a targeted manner so that it no longer impinges on the build plane, in precisely the locations in which attenuation is desired.

So that the device can be used as flexibly as possible, it is favourable if the correcting or filtering coating takes a form for absorbing and deflecting radiation in a wavelength range from approximately 200 nm to approximately 900 nm. In particular, it is advantageous if the correcting or filtering coating absorbs or reflects radiation in a wavelength range from approximately 350 nm to approximately 550 nm. A correcting or filtering coating of this kind is suitable in particular for all types of electromagnetic radiation sources that emit light in the near-ultraviolet range, the visible range of the spectrum and the near-infrared range. They may in particular be light-emitting diodes or laser diodes with clearly defined line spectra.

According to a further preferred embodiment of the invention, it may be provided for the substrate to take a form that is at least partially transparent to radiation or at least partially reflective of radiation. Depending on whether the radiation field passes through the substrate or is deflected by it, it is favourable if the substrate can either transmit or reflect the radiation. In particular, in this way intensity inhomogeneities of the radiation field generated by the radiation source may be corrected both with absorption and also with reflection.

The device may take a particularly compact form if the substrate is in the form of an optical lens, an optical mirror, a glass plate, a plastics plate, a plastics film or a transparent or reflective material. Substrates of this kind make it possible in particular to take on a dual function. On the one hand they form optical elements of an imaging device of a device for producing three-dimensional articles, and on the other they serve to correct intensity inhomogeneities of the radiation field generated by the radiation source. In particular, planar substrates may be coated and handled in a particularly simple manner. For example, a glass plate or plastics plate or indeed a transparent plastics film may be arranged directly parallel to the build plane, for example directly above or below the container in which the material to be solidified is located.

The correcting or filtering device can be produced at particularly low cost if the correcting or filtering coating is printed onto the substrate. For example, in this way it is possible to print onto glass plates or plastics films. Preferably, printing onto the substrates is in a grid pattern, with a higher resolution than the resolution of the three-dimensional article to be produced. This makes it possible in particular first to measure the radiation field of the radiation source and then, using for example a conventional laser printer, directly to print onto a plastics film and then to use it as the correcting or filtering device.

It is advantageous if the correcting or filtering coating has at least two correcting or filtering coating regions which have a minimum and a maximum radiation attenuation value, and if a difference between the minimum and the maximum radiation attenuation value corresponds to a difference between a minimum and a maximum radiation intensity of the radiation field in a calibration surface between the radiation source and the build plane, or in the build plane. This embodiment makes it possible in particular to absorb only as much of the radiation as is necessary to homogenise completely the radiation field in the calibration surface and/or in the build plane. The calibration surface may in particular be any surface that is defined between the radiation source and the build plane. However, it may also be defined by the build plane itself, in particular by the surface region that is defined by the material that is to be solidified in the container provided therefor. Curved calibration surfaces are preferably selected if the correcting or filtering coating is likewise curved. For example, this may be the case if the correcting or filtering coating is applied to a surface of an optical lens that is curved, or to a curved mirror. In particular, the minimum radiation attenuation value may be zero or approximately zero, with the result that no or virtually no radiation is absorbed in the correcting or filtering coating region with the minimum radiation attenuation value. This is preferably selected for the regions in which the radiation field has minimal intensity in the calibration surface.

It is advantageous if the calibration surface has a grid pattern and defines a plurality of calibration surface pixels, if the correcting or filtering coating includes a plurality of correcting or filtering coating pixels that corresponds to the plurality of calibration surface pixels, and if a radiation attenuation value of each correcting or filtering coating pixel is adapted to the intensity of the radiation of the radiation source that impinges on this correcting or filtering coating pixel such that, after passing through the correcting or filtering coating pixel, the intensity of the radiation field is identical or substantially identical for all the correcting or filtering coating pixels. Here, the term "identical or substantially identical" should be understood to mean that the radiation intensity should as far as possible be identical but at least more homogeneous than without the correcting or filtering device. As mentioned above, the number of calibration surface pixels and thus also of correcting or filtering coating pixels may exceed the number of optical pixels used for forming the three-dimensional article. This allows the correcting or filtering coating itself to be formed in a grid pattern and for example to form a raster image.

Preferably, an absorption or reflection behaviour on the part of the correcting or filtering device is constant over time. This means in particular that an absorption or reflection behaviour on the part of the correcting or filtering device does not change with time. This is the case for example with a substrate having a correcting or filtering coating that does not change with time but which, at most, fades somewhat over a long time scale because of the action of radiation in producing three-dimensional articles. In all cases, with a correcting or filtering device whereof the absorption behaviour is constant over time, there is no need for a specific control of the device, or for a correction of the intensity distribution of the radiation field to be calculated. In this way, the manufacturing costs for a device for producing three-dimensional articles can be markedly reduced. All that is required in order that three-dimensional articles of optimum quality can be produced is a one-off measurement of the radiation field, or one which only has to be repeated after a number of months, and a correcting or filtering device that is adapted appropriately to the inhomogeneity of the intensity distribution of the radiation field. A repeated measurement is useful in particular if the radiation field changes over time, so the inhomogeneity of the intensity distribution of the radiation field can be measured again annually or at an interval of a few months, and a correcting or filtering device that is adapted thereto can be modified or a new one produced.

Further, the invention relates to a method for producing a device for correcting an inhomogeneous intensity distribution of a radiation field generated by a radiation source, in particular a radiation source of a device for producing three-dimensional articles by the layer-by-layer solidifying, in a build plane, of a material that is solidifiable under the action of radiation, wherein an intensity distribution of the radiation field is measured or calculated in a calibration surface between the radiation source and the build plane or in the build plane and a correcting or filtering device to be introduced into the radiation path is formed in dependence on the intensity distribution of the radiation field in the calibration surface such that the intensity distribution of the radiation field in the build plane is homogeneous after passing through the correcting or filtering device.

As already mentioned above, an intensity distribution of the radiation field of the radiation source that is used is thus measured once in a calibration surface, for example in the build plane, and a correcting or filtering device is formed in order to compensate for the inhomogeneities. Here, the correcting or filtering device is formed such that the intensity distribution of the radiation field is homogeneous in the build plane once it has passed through the correcting or filtering device, or is at least more homogeneous than without the correcting or filtering device.

It is advantageous if the intensity distribution of the radiation source is measured in a calibration surface that defines a calibration plane. It is markedly simpler to measure an intensity distribution in a plane than in a curved surface. For example, the calibration plane may coincide with the build plane. The intensity distribution of the radiation source in the calibration surface may for example be measured using suitable radiometers, or at the same time for a plurality of surface regions or pixels using a radiation-sensitive radiation detector having a grid pattern, for example in the form of a CCD chip.

It is favourable if, in order to form the correcting or filtering device, a substrate is provided, if a correcting or filtering coating is formed on or applied to the substrate, and if the correcting or filtering coating is formed in dependence on the intensity distribution of the radiation field in the calibration surface such that the intensity distribution of the radiation field in the build plane is homogeneous after passing through the correcting or filtering device. Thus, the correcting or filtering coating may be as thin as desired. It is not mandatory for the correcting or filtering coating to cover the entire surface of the substrate. It is in particular also possible to provide the substrate with a grid pattern of absorbing regions or pixels so that, in this way, in a particular surface region only some of the radiation can pass through the substrate or be reflected thereby.

Preferably, there is provided as the substrate an optical lens, an optical mirror, a glass plate, a plastics plate or a plastics film. In particular, substrates of this kind can form parts of an imaging device of a device for producing three-dimensional articles. They can be handled simply and can be mounted on the device for producing three-dimensional articles, for example in mounts that are provided specifically for this purpose.

The correcting or filtering coating can be formed in a particularly simple manner by printing onto the substrate for the purpose of forming it. In particular, it is possible to print in a grid pattern onto the substrate for the purpose of forming the correcting or filtering coating. As stated above, a resolution of the grid for forming the correcting or filtering coating may be higher, in particular markedly higher, than a resolution of the image dot grid or the pixel grid determining the image dots for forming the three-dimensional article.

According to a further preferred variant of the method according to the invention, it may be provided for a minimum value and a maximum value of the intensity distribution of the radiation in the calibration surface to be measured, and for the surface region of the correcting or filtering coating to which the minimum value of the intensity distribution in the calibration surface corresponds to take a form having a minimum absorption value for the radiation, and for the surface region of the correcting or filtering coating to which the maximum value of the intensity distribution corresponds to take a form having a maximum absorption value for the radiation. As a result of this procedure, it is possible in particular to determine which surface regions of the radiation field need not be attenuated. In this way, the correcting or filtering coating may in particular take a form such that only the surface regions in which a radiation intensity is greater than a minimum value of the intensity distribution are attenuated.

It is favourable if the correcting or filtering coating takes a form such that a difference between the maximum value and the minimum value of the intensity distribution of the radiation field corresponds to a difference between the maximum absorption value and the minimum absorption value. In this way, it is possible to ensure that the correcting or filtering device does not absorb more radiation than is absolutely necessary.

Further, it is favourable if the calibration surface has a grid pattern and defines a plurality of calibration surface pixels, if the correcting or filtering coating includes a plurality of correcting or filtering coating pixels that corresponds to the plurality of calibration surface pixels, and if a radiation attenuation value of each correcting or filtering coating pixel is adapted to the intensity of the radiation of the radiation source that impinges on this correcting or filtering coating pixel such that the intensity of the radiation after passing through the correcting or filtering coating pixel is identical for all correcting or filtering coating pixels. This embodiment of the method in particular makes it possible for the correcting or filtering coating to form a grid pattern. Preferably in this case, a resolution of the grid pattern of the calibration surface is higher than a resolution of the image dots defined for forming the three-dimensional article. In particular, two or more calibration surface pixels may be defined for each image dot of the three-dimensional article.

Further, the invention relates to a method for producing a three-dimensional article by the layer-by-layer solidifying of a material that is solidifiable under the action of radiation, wherein the radiation is imaged in a build plane using an optical imaging device, for the purpose of successively building up solid article layers in the build plane, in which method setpoint layer image data are provided for each article layer to be solidified in the build plane, wherein a device for correcting an inhomogeneous intensity distribution of a radiation field defined by the radiation is provided and is introduced into a radiation path between a radiation source generating the radiation and the build plane, and wherein a radiation field corresponding to the setpoint layer image data is generated for the purpose of irradiating the build plane.

The proposed method in particular makes it possible to produce three-dimensional articles of high quality without constantly having to make a computer-processed correction to the intensities of exposure. Because there is no need for calculations in order to homogenise the radiation field, three-dimensional articles can be formed more quickly. To compensate for the inhomogeneities of the radiation field that is generated by a radiation source, all that is done is to provide a device for correcting an inhomogeneous intensity distribution of the radiation field and to introduce it into the radiation path in the stated manner. Further corrections are optionally possible in order in particular to achieve even better homogeneity of the radiation field in the build plane.

It is favourable if one of the above-mentioned advantageous devices for correcting an inhomogeneous intensity distribution of the radiation is provided and is introduced into a radiation path between a radiation source generating the radiation and the build plane.

The use of one of the above-mentioned advantageous devices for correcting an inhomogeneous intensity distribution of the radiation then in particular also provides the above-mentioned advantages.

Further, the invention relates to a device for producing a three-dimensional article by the layer-by-layer solidifying of a material that is solidifiable under the action of radiation, having a radiation source for generating the radiation and an optical imaging device for imaging, in a build plane, a radiation field that is generated by the radiation source, comprising a device for correcting an inhomogeneous intensity distribution of a radiation field generated by a radiation source, in particular a radiation source for a device for producing three-dimensional articles by the layer-by-layer solidifying, in a build plane, of a material that is solidifiable under the action of radiation, characterised by a correcting or filtering device that is to be introduced, between the radiation source and the build plane, into a radiation path of a device for producing three-dimensional articles by the layer-by-layer solidifying of a material that is solidifiable under the action of radiation.

A device for producing a three-dimensional article, developed in this way, then likewise has the advantages that are mentioned above in conjunction with advantageous embodiments of devices for correcting inhomogeneous intensity distributions.

It is favourable if the radiation source includes at least one light-emitting diode or at least one laser diode. Using radiation sources of this kind, relatively homogeneous radiation fields can be generated, which moreover have a high level of constancy in the long term.

Further, the invention relates to use of a device for producing a three-dimensional article by the layer-by-layer solidifying of a material that is solidifiable under the action of radiation, as described above, for carrying out a method for producing a three-dimensional article by the layer-by-layer solidifying of a material that is solidifiable under the action of radiation, as likewise described above.

Using the devices described, the methods described can be carried out particularly advantageously.

Figure 2:
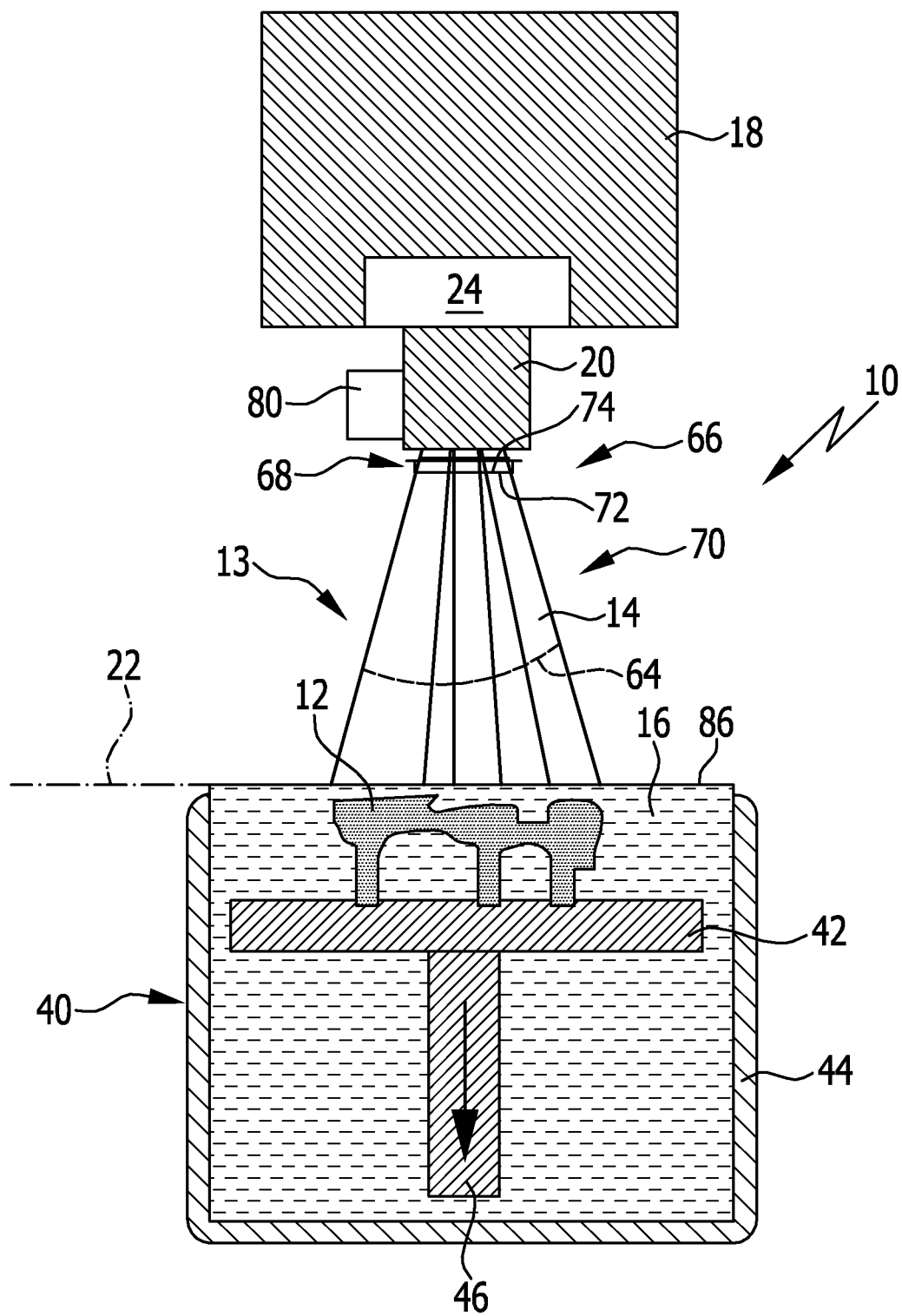
FIG. 2 shows a schematic view of a further part of a device for producing a three-dimensional article.
Figure 3:
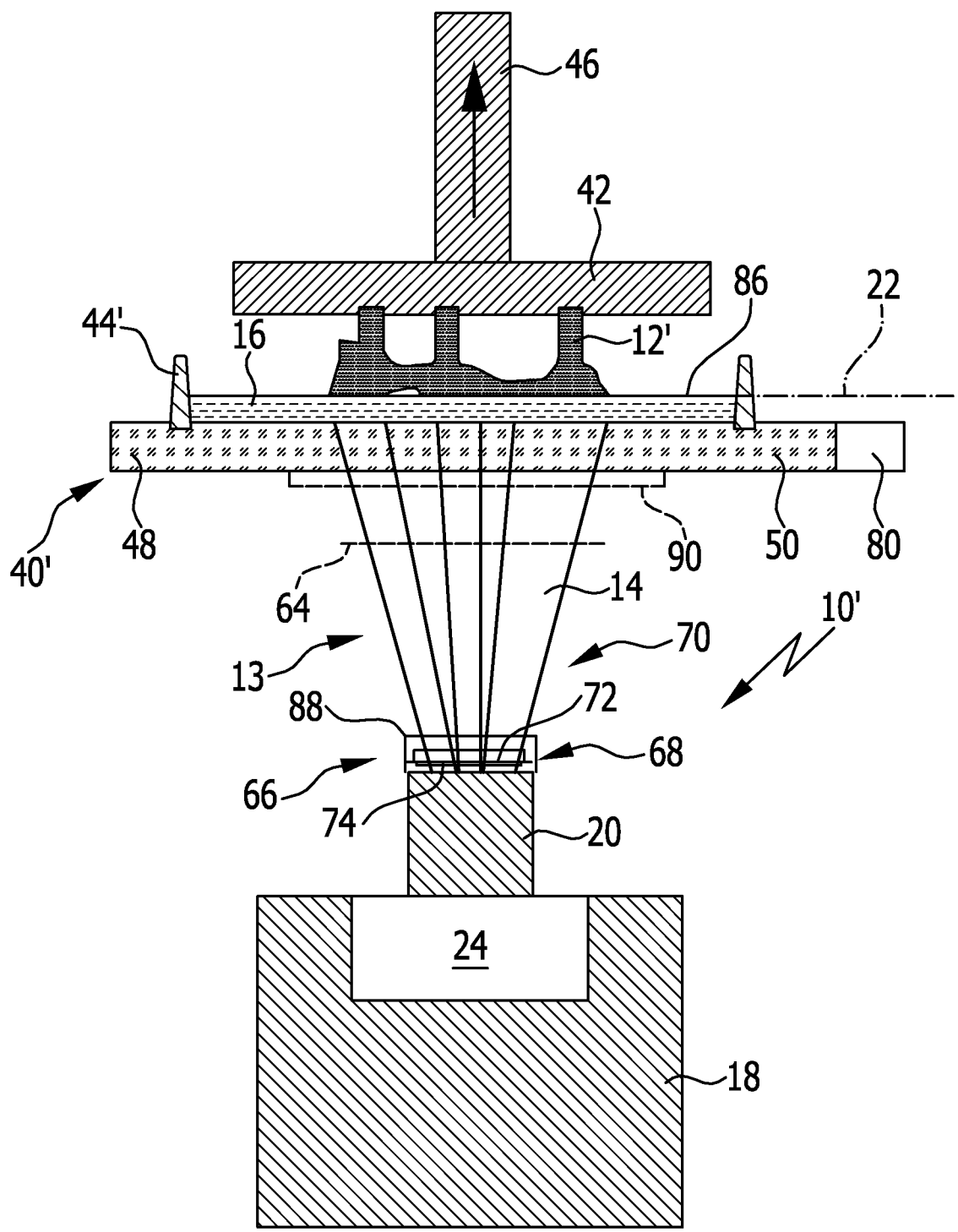
FIG. 3 shows a schematic view of a further part of a second exemplary embodiment of a device for producing a three-dimensional article.

The schematic structure of a device 10 for producing a three-dimensional article 12 by the layer-by-layer solidifying of a material 16 that is solidifiable under the action of radiation 14 that defines a radiation field 13 is illustrated schematically in FIGS. 1 to 3 for two different structural variants.

The device 10 includes a radiation source 18 that includes an imaging optical system 20 for imaging an article layer image in an image/build plane 22—also simply called the build plane below. The imaging optical system 20 includes a masking unit 24 that is controllable by an exposure mask generating device 26. Using the exposure mask generating device 26, it is possible to generate an exposure mask 28 for each article layer of the article 12, in the form of a 2-bit bitmap 30. Each 2-bit bitmap 30 thus has only two bit values 32 and 34, wherein the bit value 32 enables a greater transparency to the radiation 14 than the bit value 34. In an extreme case, the bit value 32 may be entirely "transparent" to the radiation 14 and the bit value 34 entirely "opaque" to the radiation 14. In all cases, the transparency of the pixels of the 2-bit bitmap 30 having the bit value 32 is greater than the transparency of the pixels having the bit value 34.

Further, the exposure mask generating device 26 includes a memory device 36 that may contain for example stored native information regarding the article layers that are to be formed for the article 12 to be formed. This information may in particular be transferred to a computer 38 or another suitable computing device. In dependence on the layer information, the computer 38 calculates a 2-bit bitmap 30 which is then transferred to the masking unit 24 in order for example to control an LCD display during exposure by transmission, or a digital micromirror device having at least one deflection mirror, in order in this way to image the radiation 14 that is generated by the radiation source 18 onto the image/build plane 22 in a manner corresponding to the article layer to be formed. In the image/build plane 22, the radiation 14 impinges on not yet solidified viscous material 16, which is solidified by the input of energy by exposure after a certain time period, in dependence on the material and the radiation intensity. An individual exposure time may be predetermined for each article layer, so for example the masking unit 24 blocks the radiation 14 completely if no article layer is to be formed, and transmits the radiation 14 selectively if an article layer is to be formed.

In particular, two types of carrier systems 40 are used for the purpose of forming articles 12. In the variant that is illustrated schematically in FIG. 2, a carrier plate 42 is located in a container 44 that is filled with the material 16. By means of a drive device 46, the carrier plate 42 is movable into the container 44, preferably in predetermined discrete steps that are executed every time a further article layer has solidified as a result of the material curing on the surface of the already partly formed article 12, and so forming a further article layer.

As an alternative, as in the carrier system 40' that is illustrated schematically in FIG. 3, the radiation 14 may also be imaged in the image/build plane 22 by a radiation-transparent plate 48 that forms a base 50 of the alternative container 44'. The article layer to be formed is likewise created by the input of energy in the image/build plane 22, below the last article layer to have been formed. Once an article layer has cured, the drive unit 46 moves the article 12 that has already been formed away from the container 44' somewhat in a predetermined manner, in particular by a distance that corresponds to a thickness of the article layer that has just been formed, so to speak withdrawing it from the container 44 somewhat. It is now possible, in a following step, for the next article layer to be produced by exposing the material 16 in the image/build plane 22.

The problem described in the introduction, of an inhomogeneous intensity distribution in the radiation field 13, arises for example because, when the radiation intensity in the build plane 22 is measured, for example using a radiation detector such as a light-sensitive diode, the intensity graph illustrated schematically in FIG. 4 is obtained.

It can be seen from the intensity graph that the radiation field 13 of the radiation source 18, for example a light-emitting diode or a laser diode, typically has the highest radiation intensity in the centre 52, somewhat less radiation intensity in a first ring or region 54 around the centre 52, a more attenuated radiation intensity in a second ring or region 56 that surrounds the first ring 54, and an even further attenuated radiation intensity in the region 58 around the second ring 56. In practice, far more such stepped rings or regions may be obtained, in particular depending on the type and shape of the radiation source 18 and the desired degree of precision of the steps.

A pixel grid 60 is drawn in the intensity graph in FIG. 4, with a plurality of identical calibration pixels 62. In particular, the calibration pixels 62 may as described be measured successively, using a simple radiation detector, or be measured simultaneously using a suitable two-dimensional radiation detector such as a CCD chip, in order in this way to obtain the intensity profile.

So that the article 12 or 12' to be produced solidifies homogeneously, it is desirable for the radiation field 13 not to have an intensity profile as illustrated in FIG. 4 but to be homogeneous. In other words, the objective is for all the calibration pixels 62 to be acted upon by the same intensity of radiation 14.

Since in practice there is no radiation source 18 that has an intensity profile that is homogeneous or constant to the desired extent in the build plane 22 or in a calibration surface 64 running between the radiation source 18 and the build plane 22, in the devices 10 and 10' a correcting device 66 is additionally used for correcting an inhomogeneous intensity distribution of the radiation field 13 generated by the radiation source 18.

The correcting device 66 includes a correcting or filtering device 68 to be introduced into a radiation path 70 of the device 10 or 10', between the radiation source 18 and the build plane 22. The correcting or filtering device 68 that is provided in the case of devices 10 and 10' has a substrate 72 that includes a correcting or filtering coating 74. The correcting or filtering coating 74 may be formed on the substrate 72 or be applied thereto.

The correcting or filtering coating 74 is in particular formed for the purpose of at least partly absorbing the radiation 14, preferably for absorbing radiation in a wavelength range from approximately 300 nm to approximately 900 nm.

The substrate 72 is formed to be transparent or substantially transparent to the radiation 14. For example, it takes the form of a transparent plate, such as a glass plate, or a transparent plastics film 76. A plastics film 76 of this kind is illustrated schematically in FIG. 5. The plastics film 76 has a grid pattern and has a pixel grid 78 laid over it in a manner corresponding to the pixel grid 60. The pixel grid 78 corresponds to the pixel grid that corresponds to the setpoint layer image data which are to be imaged onto the build plane 22 using the optical imaging system 20. The pixel grid 78 includes a plurality of image pixels 80 of identical size.

In order to compensate for the inhomogeneity in the intensity profile of the radiation field 13, the pixel grid 78 is overlaid on the regions 52, 54, 56 and 58. So that the respective pixels 80 are acted on in all regions 52, 54, 56 and 58 by an identical radiation intensity, the correcting or filtering coating 74 is applied to the substrate 72 such that the most radiation is absorbed in the region 52, somewhat less is absorbed in the region 54, even less is absorbed in the region 56 and even less than that is absorbed in the region 58.

A maximum value of the intensity distribution of the radiation field 13 is measured in the centre 52, as described, and a minimum value of the intensity distribution of the radiation field 13 is measured in the region 58.

In order to obtain a homogeneous intensity distribution, in the correcting or filtering coating 74 a minimum absorption value is provided in the region 58 and a maximum absorption value for the radiation 14 in the centre 52.

The correcting or filtering coating 74 may for example take a form such that its thickness varies in dependence on the regions 52, 54, 56 or 58, so that it is that much thicker in the regions in which the intensity of the radiation field 13 is the greatest.

Ideally, the correcting or filtering coating 74 is omitted from the region 58 having the minimum value of the intensity distribution, or it has a minimal value there.

As an alternative to different coating thicknesses for the different regions 52, 54, 56 and 58, it is also possible, as illustrated schematically in FIG. 5 for the pixels 80a, 80b, 80c and 80d, for a filter pixel grid 82 to be overlaid on each image pixel 80, wherein the resolution of the filter pixel grid 82 preferably corresponds to an integer multiple of the resolution of the pixel grid 78. The more finely each image pixel 80 is subdivided into filter pixels 84, the more finely can a filter property of the correcting or filtering coating 74 be set.

In FIG. 5, it is provided for example for six filter pixels 84 to be made black for the image pixel 80a in the centre 52, on which the maximum value of the intensity distribution acts, in order to prevent transmission of the radiation 14.

In the region 54, the intensity of the radiation 14 is somewhat less than in the centre 52. For this reason, the first ring 54 need not absorb as much of the radiation 14 in order for the intensity of the radiation 14 to have the same intensity for all the image pixels 80 after it has passed through the correcting or filtering device 68. For this reason, only four filter pixels 84 are made black in the pixel 80b. Accordingly, in the image pixel 80c in the second ring 56 or region 56, two filter pixels 84 are made black, and in the image pixel 80d in the region 58 no filter pixels 84 at all are made black. This means that the radiation 14 can pass more or less unhindered through the image pixel 80d.

For the sake of clarity, not all the image pixels 80 are provided with the filter pixel grid 82 in FIG. 5. However, this may be done accordingly for each image pixel 80. In this way, it is possible to print a corresponding black-and-white bitmap for example onto a transparent plastics film or a glass plate in order to form in this way a correcting or filtering coating 74 composed of filter pixels 84. Thus, the correcting or filtering coating comprises filter pixels that have either the bit value 0 or the bit value 1. For example, the bit value 0 may correspond to making the filter pixel 84 black and the bit value 1 to not making the filter pixel 84 black.

In the manner described, the devices 10 and 10' may initially be constructed in a conventional manner. In that case, the build plane 22 may be irradiated with the radiation source 18 over its entire surface in order to measure the radiation field 13. This may be done for example directly in the build plane 22, with the result that the calibration surface 64 defines a calibration plane 86, or in any other desired curved or planar calibration surface 64, by measuring the calibration surface 64 either over a surface using a two-dimensional radiation detector, or in a grid pattern using a one-dimensional radiation detector.

On the basis of the measured intensity profile of the radiation field 13, as illustrated schematically in FIG. 4, the corresponding correcting or filtering coating 74 can be produced, which is then exactly matched to the measured device 10 with the radiation source 18.

Once the correcting or filtering device 68 has been produced, it may be introduced into the radiation path 70. Preferably, this is done where the radiation field 13 was measured. If the correcting or filtering device 68 is introduced at a different point on the radiation path 70, an additional adaptation of the size of the correcting or filtering device 68 transversely to the direction of radiation may possibly have to be carried out.

The correcting or filtering device 68 may for example be retained in a mount 88. In particular, a mount 90 that can receive a correcting or filtering device 68 may be provided on the base 50.

Figure 6:
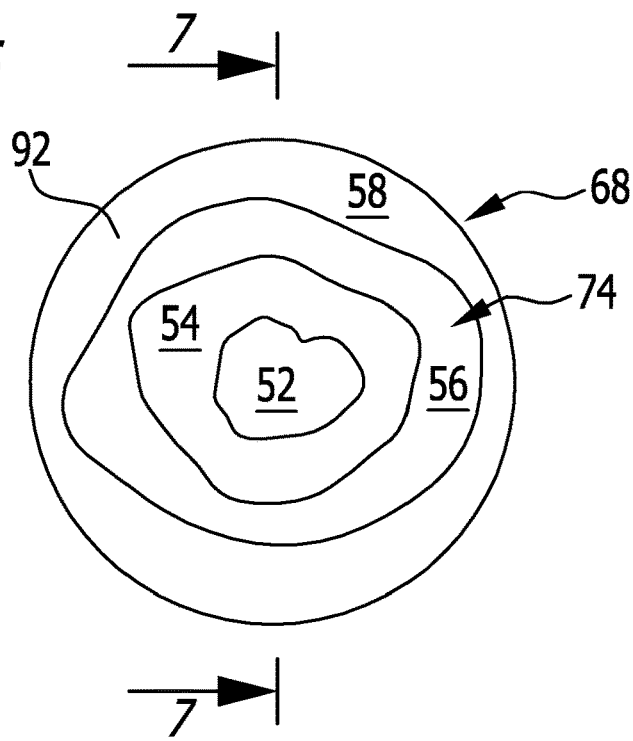
FIG. 6 shows a schematic plan view of a lens having a correcting or filtering coating.
Figure 7:
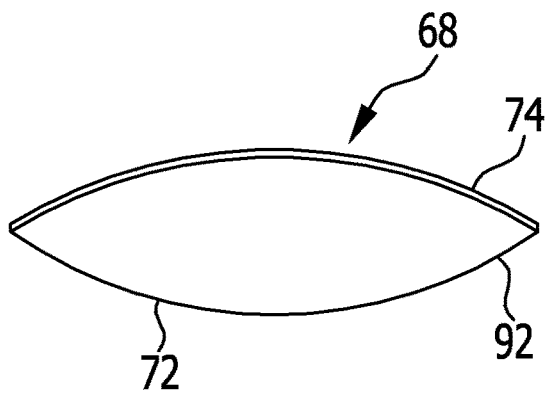
FIG. 7 shows a sectional view along the line 7-7 in FIG. 6.

If the imaging optical system 20 includes for example a lens 92, then a correcting or filtering coating 74 may also be applied directly to a surface thereof. The lens 92 then forms the substrate 72, and the lens 92 together with the correcting or filtering coating 74 forms the correcting or filtering device 68. This is illustrated schematically in FIGS. 6 and 7.

In a manner similar to the plastics film illustrated by way of example in FIG. 5, it is also possible to print onto the lens 92 with a grid pattern in order to form the correcting or filtering device 68.

Figure 8:
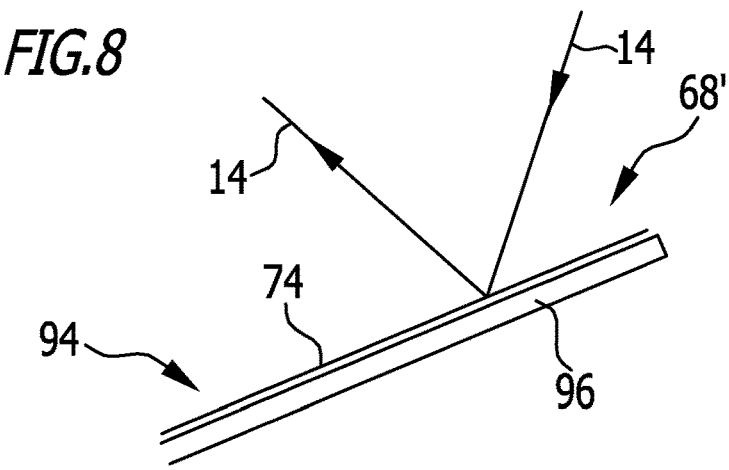
FIG. 8 shows a schematic sectional view of a deflecting mirror having a correcting or filtering coating.

FIG. 8 illustrates schematically a further optical element 94 in the form of a mirror 96 by means of which the radiation 14 can be deflected by reflection.

Similarly to the case of the lens 92 or the plastics film 76, a correcting or filtering coating 74 that is adapted to the measured intensity profile of the radiation field 13 of the radiation source 18 can be applied to the mirror 96, for example by being printed on. When the radiation 14 impinges on the coated mirror 96, then after reflection at the mirror 96 the radiation field 13 has a homogeneous intensity distribution. In this way, after passing through the optical element 94, as described above for the plastics film 76 the radiation field 13 has the same intensity for each image pixel 80 for the mirror 96 as well.

As explained, at least a one-off measurement of the device 10 or the radiation field 13 of the radiation source 18 is required for forming the correcting or filtering device 68. In particular in the case of radiation sources 18 having only a small change in radiation intensity over the long term, it is thus possible to achieve homogenisation of the radiation intensity of the radiation 14 emitted by the radiation source 18 simply and at low cost.

If, after a certain time, for example as a result of ageing or another type of change in the radiation source 18 as a result of operating it, a change in the intensity profile should arise, the described production of the correcting device 66 can be carried out again. It is particularly simple to exchange the correcting or filtering device 68 if a plastics film 76 as described above is used in a mount 88 or 90 provided therefor.

LIST OF REFERENCE NUMERALS 10, 10' Device
12, 12' Article
13 Radiation field
14 Radiation
16 Material
18 Radiation source
20 Imaging optical system
22 Image/build plane
24 Masking unit
26 Exposure mask generating device
28 Exposure mask
30 2-bit bitmap
32 Bit value
34 Bit value
36 Memory device
38 Computer
40, 40' Carrier system
42 Carrier plate
44, 44' Container
46 Drive unit
48 Plate
50 Base
52 Centre/region
54 First ring/region
56 Second ring/region
58 Region
60 Pixel grid
62 Calibration pixel
64 Calibration surface
66 Correcting device
68 Correcting or filtering device
70 Radiation path
72 Substrate
72 Correcting or filtering coating
76 Plastics film
78 Pixel grid
80 Image pixel
82 Filter pixel grid
84 Filter pixel
86 Calibration plane
88 Mount
90 Mount
92 Lens
94 Optical element
96 Mirror

What is claimed is:

1. A device for correcting an inhomogeneous intensity distribution of a radiation field generated by a radiation source, the radiation source for a device for producing three-dimensional articles by a layer-by-layer solidifying, in a build plane, of a material that is solidifiable under the action of radiation, comprising:
a correcting or filtering device that is to be introduced, between the radiation source and the build plane, into a radiation path of the device for producing three-dimensional articles by the layer-by-layer solidifying of the material that is solidifiable under the action of radiation;
wherein:
an absorption or reflection behaviour on the part of the correcting or filtering device is constant over time;
the correcting or filtering device includes a substrate and at least one correcting or filtering coating that is formed on or applied to the substrate;
the correcting or filtering coating takes a form for at least partly absorbing radiation or at least partly deflecting radiation from the radiation field, this radiation being generated by the radiation source;
the substrate takes a form that is at least partially transparent to radiation or at least partially reflective of radiation;
the substrate is in the form of a plastics film;
the correcting or filtering coating is directly printed onto the substrate with a laser printer; and
the correcting or filtering coating takes a form for absorbing or deflecting radiation in a wavelength range from approximately 200 nm to approximately 900 nm.

2. The device according to claim 1, wherein the correcting or filtering coating has at least two correcting or filtering coating regions which have a minimum and a maximum radiation attenuation value, and wherein a difference between the minimum and the maximum radiation attenuation value corresponds to a difference between a minimum and a maximum radiation intensity of the radiation field in a calibration surface between the radiation source and the build plane, or in the build plane.

3. The device according to claim 2, wherein the calibration surface is in a grid and defines a plurality of calibration surface pixels, wherein the correcting or filtering coating includes a plurality of correcting or filtering coating pixels that corresponds to the plurality of calibration surface pixels, and wherein a radiation attenuation value of each correcting or filtering coating pixel is adapted to the intensity of the radiation of the radiation source that impinges on this correcting or filtering coating pixel such that, after passing through the correcting or filtering coating pixel, the intensity of the radiation field is identical or substantially identical for all the correcting or filtering coating pixels.

4. A device for producing a three-dimensional article by a layer-by-layer solidifying of a material that is solidifiable under the action of radiation, comprising:
a radiation source for generating the radiation;
an optical imaging device for imaging, in a build plane, a radiation field that is generated by the radiation source, and
a device for correcting inhomogeneous intensity distributions which comprises:
a correcting or filtering device that is to be introduced, between the radiation source and the build plane, into a radiation path of a device for producing three-dimensional articles by the layer-by-layer solidifying of the material that is solidifiable under the action of radiation;
wherein:
an absorption or reflection behaviour on the part of the correcting or filtering device is constant over time;
the correcting or filtering device includes a substrate and at least one correcting or filtering coating that is formed on or applied to the substrate;
the correcting or filtering coating takes a form for at least partly absorbing radiation or at least partly deflecting radiation from the radiation field, this radiation being generated by the radiation source;
the substrate takes a form that is at least partially transparent to radiation or at least partially reflective of radiation;
the substrate is in the form of a plastics film;
the correcting or filtering coating is directly printed onto the substrate with a laser printer; and
the correcting or filtering coating takes a form for absorbing or deflecting radiation in a wavelength range from approximately 200 nm to approximately 900 nm.

5. The device according to claim 4, wherein the radiation source includes at least one light-emitting diode or at least one laser diode.

6. A system, comprising:
a radiation source; and
an apparatus for correcting an inhomogeneous intensity distribution of a radiation field generated by the radiation source for an apparatus for producing three-dimensional articles by a layer-by-layer solidifying, in a build plane, of a material that is solidifiable under the effect of radiation, the apparatus for correcting an inhomogeneous intensity distribution of the radiation field comprising:
a correcting or filtering device that is to be introduced, between the radiation source and the build plane, into a radiation path of the apparatus for producing three dimensional articles;
wherein:
the correcting or filtering coating is directly printed onto a substrate with a laser printer;
the correcting or filtering coating takes a form for absorbing or deflecting radiation in a wavelength range from approximately 200 nm to approximately 900 nm;
the correcting or filtering coating has at least two correcting or filtering coating regions which have a minimum and a maximum radiation attenuation value;
a difference between the minimum and the maximum radiation attenuation value corresponds to a difference between a minimum and a maximum radiation intensity of the radiation field in a calibration surface between the radiation source and the build plane, or in the build plane;
the calibration surface is in a grid and defines a plurality of calibration surface pixels;
the correcting or filtering coating includes a plurality of correcting or filtering coating pixels that corresponds to the plurality of calibration surface pixels;
a radiation attenuation value of each correcting or filtering coating pixel is adapted to the intensity of the radiation of the radiation source that impinges on the corresponding correcting or filtering coating pixel such that, after passing through the corresponding correcting or filtering coating pixel, the intensity of the radiation field is identical or substantially identical for all the correcting or filtering coating pixels;
an absorption or reflection behaviour on the part of the correcting or filtering device is constant over time;
an intensity distribution of the radiation field is measured or calculated in a calibration surface between the radiation source and the build plane or in the build plane;
the correcting or filtering device to be introduced into the radiation path is formed in dependence on the intensity distribution of the radiation field in the calibration surface such that the intensity distribution of the radiation field in the build plane is homogeneous after passing through the correcting or filtering device.

* * * * *